United States Patent
Jang et al.

(10) Patent No.: US 6,451,639 B1
(45) Date of Patent: Sep. 17, 2002

(54) METHOD FOR FORMING A GATE IN A SEMICONDUCTOR DEVICE

(75) Inventors: Se Aug Jang; Tae Kyun Kim; Jae Young Kim, all of Kyoungki-do; In Seok Yeo, Seoul, all of (KR)

(73) Assignee: Hynix Semiconductor Inc., Kyoungki (KR)

( * ) Notice: Subject to any disclaimer, the term of this patent is extended or adjusted under 35 U.S.C. 154(b) by 0 days.

(21) Appl. No.: 10/036,279

(22) Filed: Nov. 7, 2001

(30) Foreign Application Priority Data

Nov. 16, 2000 (KR) ......................... 2000-67945

(51) Int. Cl.[7] ............................ H01L 21/338
(52) U.S. Cl. ....................................... 438/183
(58) Field of Search ................. 438/183, 184, 438/185, 182, 197, 303, 585, 595, 592, 201

(56) References Cited

U.S. PATENT DOCUMENTS

| | | | |
|---|---|---|---|
| 5,966,597 A | * 10/1999 | Wright | ........................ 438/197 |
| 5,985,726 A | 11/1999 | Yu et al. | |
| 6,008,084 A | 12/1999 | Sung | |
| 6,048,762 A | 4/2000 | Hsia et al. | |
| 6,077,733 A | 6/2000 | Chen et al. | |
| 6,194,301 B1 | 2/2001 | Radens et al. | |
| 6,225,170 B1 | 5/2001 | Ibok et al. | |

FOREIGN PATENT DOCUMENTS

| | | |
|---|---|---|
| JP | 012538 | 1/2000 |
| JP | 036083 | 2/2001 |

* cited by examiner

*Primary Examiner*—Keith Christianson
*Assistant Examiner*—Yennhu B. Huynh
(74) *Attorney, Agent, or Firm*—Ladas & Parry

(57) ABSTRACT

A method of forming a semiconductor device gate including the steps of forming a dummy gate insulating layer on a semiconductor substrate having an isolating field oxide layer, successively depositing a dummy gate silicon layer and a hard mask layer on the dummy gate insulating layer, forming a hard mask layer and patterning the dummy gate silicon layer using the mask pattern as an etch barrier, forming a thermal oxide layer at both sidewalls of the dummy gate silicon layer by thermal oxidation on the resultant structure, forming spacers at both sidewalls of the dummy gate silicon layer, depositing an insulating interlayer on the resultant structure, polishing the insulating interlayer to expose the dummy gate silicon layer, forming a damascene structure by removing the dummy gate silicon and insulating layers, depositing a gate insulating layer and a gate metal layer on an entire surface of the semiconductor substrate having the damascene structure, and polishing the gate metal and insulating layers, thereby preventing the undercut at the bottom corners of a damascene groove.

13 Claims, 7 Drawing Sheets

METHOD FOR FORMING A GATE IN A SEMICONDUCTOR DEVICE

BACKGROUND OF THE INVENTION

1. Field of the Invention

The present invention relates generally to a method for forming a gate in a semiconductor device, and more particularly, to a method of forming a gate in a semiconductor device using a damascene process.

2. Description of the Related Art

Semiconductor device variables, such as gate width, gate insulating layer thickness, junction depth and the like are progressively being reduced as the integration of a semiconductor is increased. Fabrication methods of polysilicon gates fail to further realize the low resistance required for critical dimensions. In the mean time, developments for a gate having new gate materials as a substitute for polysilicon and having new structures are necessitated. In the past, research and development efforts were focused on a polysilicide gate using transition metal-silicide materials.

However, the polysilicide gate still contains polysilicon as a constituent, which results in increasing the difficulty in realizing low resistance. The polysilicon constituent in the polysilicide gate brings about increasingly effective thicknesses of a gate insulating layer due to a gate depletion effect, as well as threshold voltage variance due to boron penetration/dopant distribution fluctuation in a p+ doped polysilicon gate and the like, thereby limiting the ability to realize low resistance therein.

Boron penetration and gate depletion do not arise in a metal gate using no dopant. Moreover, metal gates use a metal having a work function value corresponding to a mid-band gap of silicon, and when applied to a single gate, thereby enable the formation of a symmetric threshold voltage in NMOS and PMOS areas. In this case, W, WN, Ti, TiN, Mo, Ta, TaN and the like comprise metals of which the work function values correspond to the mid-gap of silicon.

If a semiconductor device is fabricated using a metal gate, difficulty arises in patterning a metal gate, i.e., difficulty of etching, plasma damages in the etching and ion implantation processes and thermal damage caused by a thermal process after the gate formation are generated, thereby reducing the device characteristics.

Accordingly, in order to overcome these perceived disadvantages, a method of forming a metal gate is proposed that comprises the steps of forming a sacrificing gate of polysilicon, forming an insulating layer, removing the sacrificing gate, depositing a metal layer, and polishing the metal layer. The sacrificing gate is replaced by a metal gate, so that a gate is formed without utilizing an etching process. Therefore, the damascene process avoids the problems caused by the etching processes, and also enables use of conventional semiconductor fabrication processes.

FIG. 1A to FIG. 1G illustrate cross-sectional views of a conventional method of fabricating a MOSFET device having a tungsten gate using a damascene process. FIGS. 2A and 2B illustrate cross-sectional views illustrating problems resulting from a method of forming a gate in a semiconductor device using a conventional damascene process.

Referring to FIG. 1A, a field oxide layer, (not shown in the drawings) defining a device active area, is formed on a surface of a semiconductor substrate 1 and a dummy gate silicon oxide layer 2 is formed on the semiconductor substrate 1. A dummy gate polysilicon layer 3 and a hard mask layer 4 are then successively formed on the dummy gate silicon oxide layer 2.

Referring to FIG. 1B, a mask pattern 4a is formed by patterning the hard mask layer 4. A dummy gate 5 is then formed by etching the dummy gate polysilicon layer 3 and silicon oxide layer 2 using the mask pattern 4a.

Referring to FIG. 1C, LDD (lightly doped drain) regions are formed in portions of the silicon substrate 1 below both lateral sides of the dummy gate 5 by ion implantation at a relatively low dose and energy. Then, spacers 6 are formed at both sidewalls of the dummy gate 5 by using a known process. Subsequently, source region s and drain region d are formed at the portions of the semiconductor substrate 1 below both lateral sides of the dummy gate 5 by heavy ion implantation.

Referring to FIG. 1D, an insulating interlayer 7 is deposited on the semiconductor substrate 1. The dummy gate polysilicon layer 3 of the dummy gate 5 is exposed by planarizing a surface of the insulating interlayer 7 by using chemical mechanical polishing (hereinafter abbreviated CMP) on the insulating interlayer 7.

Referring to FIG. 1E, the dummy gate, exposed by CMP, is removed. A gate insulating layer 8 is then formed along a surface of the resultant structure. Subsequently, a gate metal layer 9, such as a tungsten layer, is deposited on the gate insulating layer 8.

Referring to FIG. 1F, a metal gate 9 is formed by polishing the gate metal layer 9 and the gate insulating layer 8 until the insulating interlayer 7 is exposed. Thus, a MOSFET device having the metal gate is completed, as shown.

Unfortunately, the metal gate formed by using the conventional damascene process has disadvantages as described below.

In the process of forming a damascene gate, it is very important to completely remove the dummy gate polysilicon layer 3 and silicon oxide layer 2. Yet, as shown in FIG. 2A, residues of the dummy gate polysilicon layer 3 and silicon oxide layer 2 frequently remain at the corners a of the damascene groove after wet etch, thereby preventing formation of the damascene gate.

Moreover, as shown in FIG. 2B, a portion of the silicon oxide layer 2 beneath the spacers 6 may be etched excessively from the bottom corners a of the damascene groove when the dummy gate polysilicon layer 3 and silicon oxide layer 2 are wet-etched. As a result, 'undercut' is generated so as to leave voids therein after the gate insulating layer deposition which undercut degrades the gap-filling characteristic when the gate metal is deposited.

SUMMARY OF THE INVENTION

Accordingly, the present invention is directed to a method of forming a gate in a semiconductor device that substantially obviates one or more of the problems due to limitations and disadvantages of the related art.

The object of the present invention is to provide a method of forming a gate in a semiconductor device enabling the elimination of the problems resulting at the bottom corners of a damascene groove by carrying out oxidation after dummy gate patterning in a damascene gate forming process.

Additional features and advantages of the present invention will be set forth in the following detailed description, and in part will become apparent from the description, or may be learned by practice of the invention. The objectives and other advantages of the invention will be realized and attained by the structure described in the written description and particularly pointed out in the claims hereof, as well as being illustrated in the appended drawings.

To achieve these and other advantages, and in accordance with the purpose of the present invention as embodied and broadly described, a method of forming a gate in a semiconductor device includes the steps of forming a dummy gate insulating layer on a semiconductor substrate having a field oxide layer isolating the device, depositing successively a dummy gate silicon layer and a hard mask layer on the dummy gate insulating layer, forming a hard mask layer as a mask pattern and patterning the dummy gate silicon layer using the mask pattern as an etch barrier, forming a thermal oxide layer at both sidewalls of the dummy gate silicon layer by carrying out thermal oxidation on the resultant structure after the patterning step, forming spacers at both sidewalls of the dummy gate silicon layer, depositing an insulating interlayer on the resultant structure after the spacer forming step, polishing the insulating interlayer so as to expose the dummy gate silicon layer, forming a damascene structure by removing the dummy gate silicon and insulating layers using the insulating interlayer as another etch barrier, depositing a gate insulating layer and a gate metal layer on an entire surface of the semiconductor substrate having the damascene structure, and polishing the gate metal and insulating layers until the insulating layer is exposed.

Preferably, the dummy gate insulating layer is formed of a silicon oxide layer and the thermal oxidation is carried out at a temperature of from 700 to 850° C. so as to form the thermal oxidation layer 50 to 100 Å thick, the dummy gate silicon layer is formed of a doped polysilicon layer and the dummy gate silicon and insulating layers are removed using an isotropic etch.

In another aspect of the present invention, a method of forming a gate in a semiconductor device includes the steps of forming a dummy gate insulating layer on a semiconductor substrate having a field oxide layer isolating the device, depositing successively a dummy gate silicon layer and a hard mask layer on the dummy gate insulating layer, forming a hard mask layer as a mask pattern and patterning the dummy gate silicon layer using the mask pattern as an etch barrier and rounding bottom corners of the dummy gate silicon layer inwardly, forming a thermal oxide layer at both sidewalls of the dummy gate silicon layer by carrying out thermal oxidation on the resultant structure after the rounding step, forming spacers at both sidewalls of the dummy gate silicon layer, depositing an insulating interlayer on the resultant structure after the spacer forming step, polishing the insulating interlayer so as to expose the dummy gate silicon layer, forming a damascene structure by removing the dummy gate silicon and insulating layers using the insulating interlayer as another etch barrier, depositing a gate insulating layer and a gate metal layer on the entire surface of the semiconductor substrate having the damascene structure, and polishing the gate metal and insulating layers until the insulating layer is exposed.

Preferably, the hard mask and dummy gate silicon layers are patterned by dry etch and the dry etch is carried out by performing a main etch and an over-etch by using $Cl_2/O_2$ gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Figure 1A:
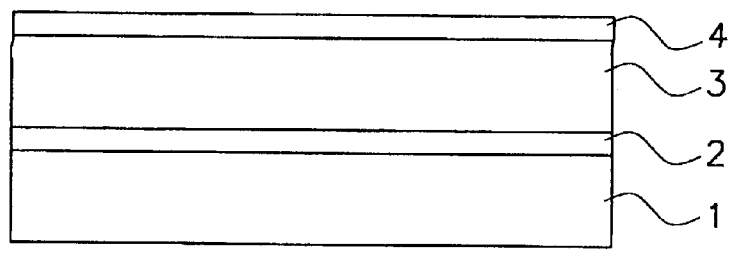
FIGS. 1A to 1F illustrate cross-sectional views of the conventional process of fabricating a gate in a semiconductor device using a damascene process.
Figure 1B:
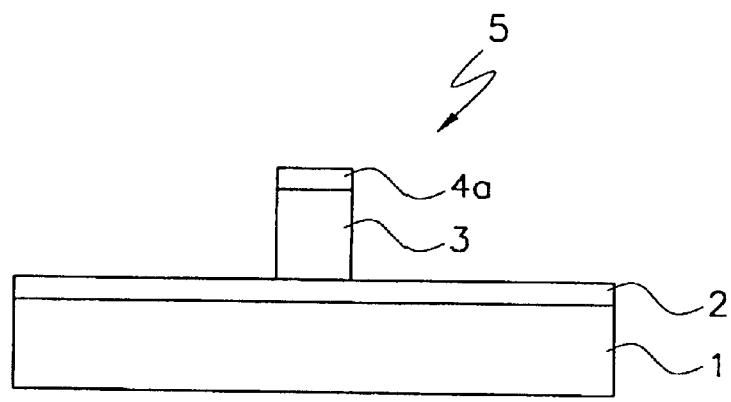
Figure 1C:
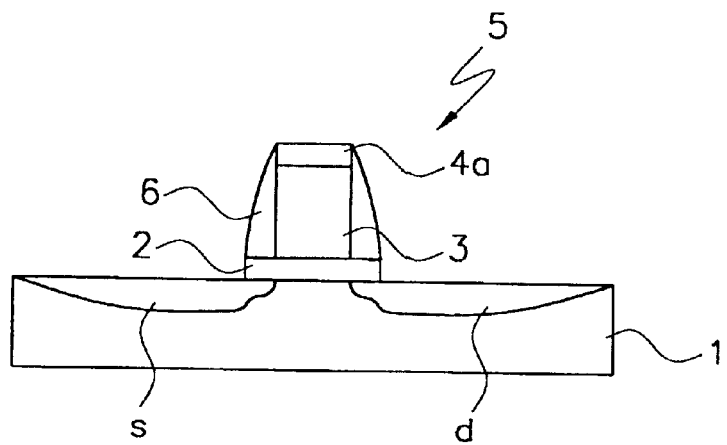
Figure 1D:
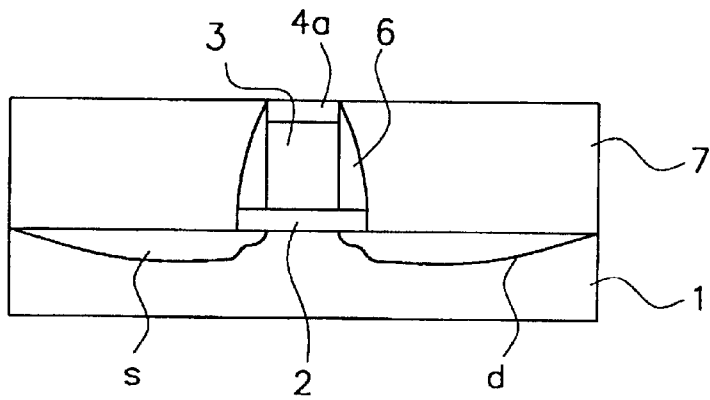
Figure 1E:
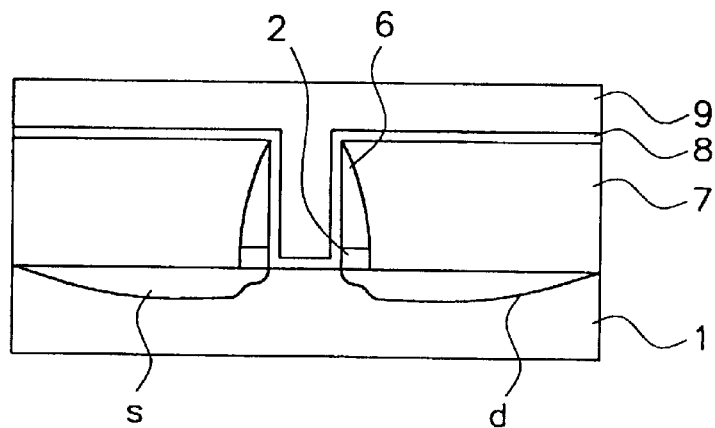
Figure 1F:
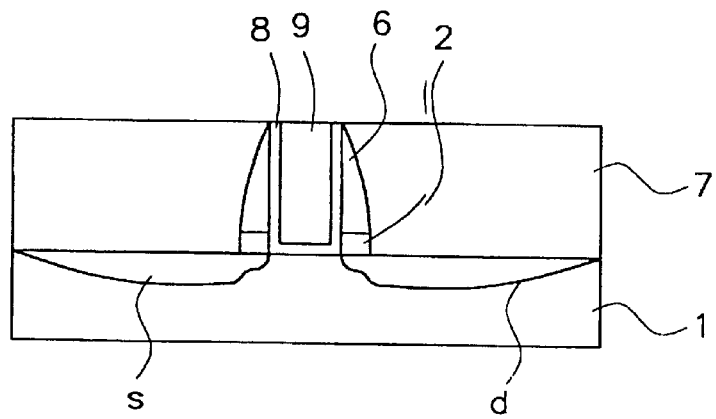
Figure 2A:
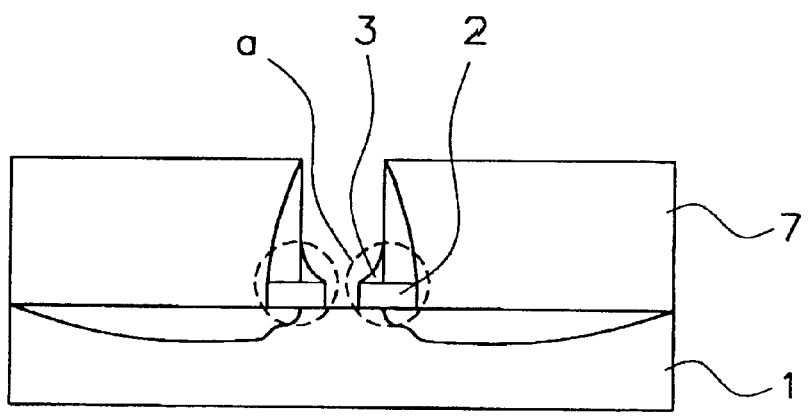
FIG. 2A and FIG. 2B illustrate cross-sectional views illustrating problems resulting from using conventional methods of forming a gate in a semiconductor device such as a damascene process.
Figure 2B:
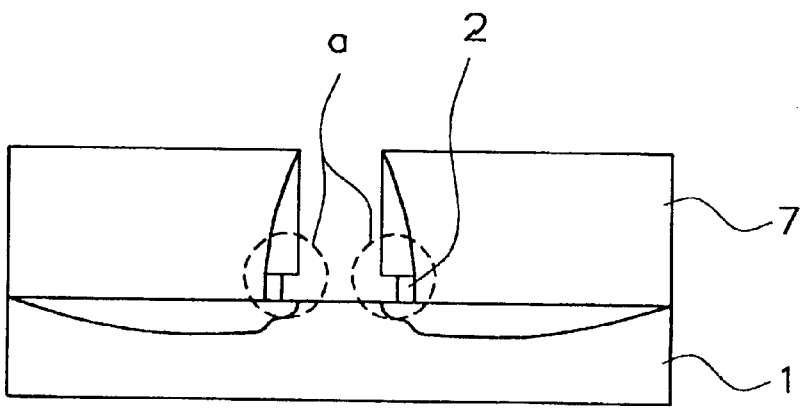

Reference will now be made in detail to the preferred embodiments of the present invention, examples of which are illustrated in the accompanying drawing FIGS. 3A to 3E and FIGS. 4A to 4F. Where possible, the same reference numerals will be used to illustrate like elements throughout the specification.

FIGS. 3A to 3E illustrate cross-sectional views of the steps of fabricating a gate in a semiconductor device using a damascene process according to an embodiment of the present invention, and FIGS. 4A to 4F illustrate cross-sectional views of the steps of fabricating a gate in a semiconductor device using a damascene process according to another embodiment of the present invention.

Figure 3A:
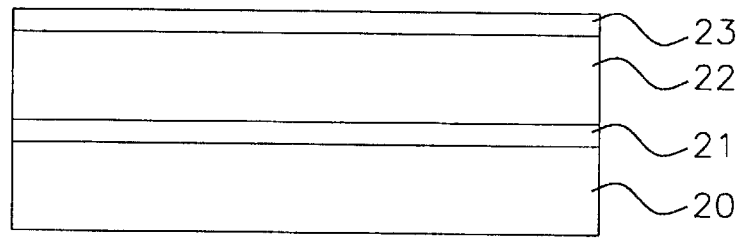
FIGS. 3A to 3E illustrate cross-sectional views of the steps of fabricating a gate in a semiconductor device using a damascene process according to an embodiment of the present invention.

Referring to FIG. 3A, a field oxide layer (not shown) defines a device formed on a surface of a semiconductor substrate 20. A dummy gate silicon oxide layer 21 is deposited on the semiconductor substrate 20. A dummy gate silicon layer 22 and a hard mask layer 23 are then successively formed on the dummy gate silicon oxide layer 21. In this case, the dummy gate silicon layer 22 is preferably formed of a doped polysilicon layer, which facilitates the establishment of the wet etch condition to remove the polysilicon layer.

Figure 3B:
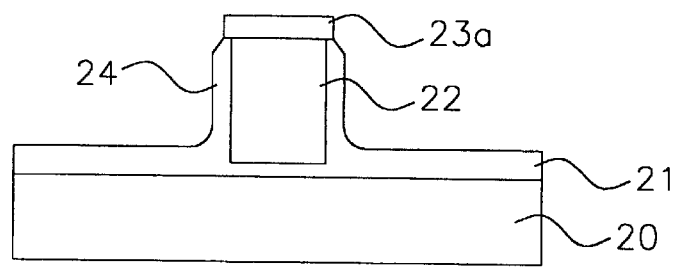

Referring to FIG. 3B, a mask pattern 23a is formed by patterning the hard mask layer 23. The dummy gate silicon layer 22 is then patterned using the mask pattern 23a as an etch barrier. Subsequently, a thermal oxide layer 24 is grown at both sidewalls of the dummy gate silicon layer 22 by thermal oxidation on the semiconductor substrate 20. In this process step, the dummy gate silicon oxide layer 21 becomes thickened somewhat, but no thermal oxide layer is grown beneath the mask pattern 23a, since the mask pattern 23a has been deposited on the dummy gate silicon layer 22. Such a thermal oxidation process is carried out at a temperature of from 700 to 850° C. so as to form the thermal oxide layer 50 to 100 Å thick.

Figure 3C:
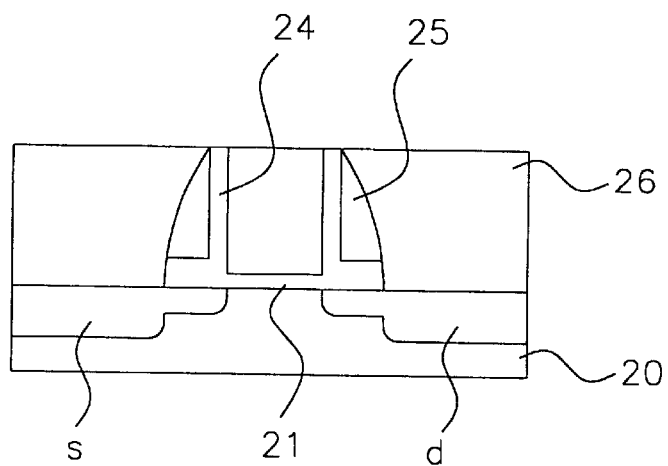

Referring to FIG. 3C, through a general process of forming source/drain regions, LDD (lightly doped drain) type source region s and drain region d are formed by carrying out ion implantation lightly on the semiconductor substrate 20, depositing a silicon nitride layer on the semiconductor substrate, carrying out blanket-etch on the silicon nitride layer to form spacers 25, and then carrying out another heavy ion implantation. An insulating interlayer 26 is deposited on the semiconductor substrate 20. Planarization of the insulating interlayer 26 is achieved by carrying out a polishing process thereon until the surface of the dummy gate silicon layer 22 is exposed.

Figure 3D:
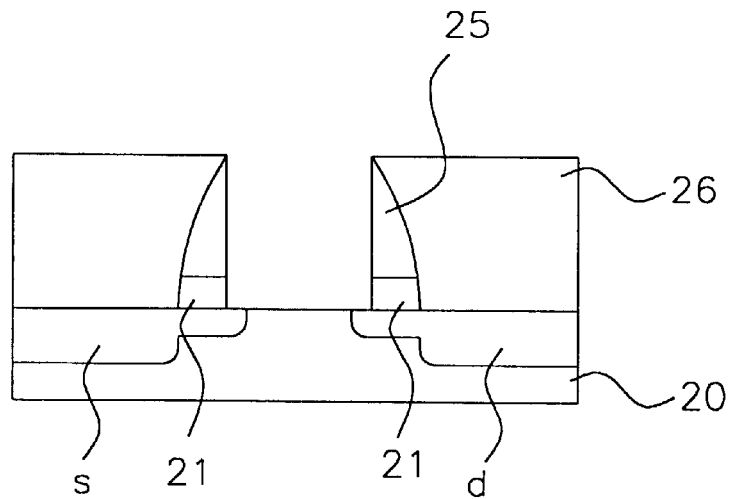

Referring to FIG. 3D, a damascene structure is formed by removing the exposed dummy gate silicon layer 22 and the dummy gate silicon oxide layer 21 underneath. In this case, the dummy gate silicon layer 22 and silicon oxide layers 24 are removed by wet etch. Yet, the thermal oxide layers 24 prevent an undercut occurring, as it does generally in using conventional methods when the dummy gate silicon oxide layer beneath the spacers 25 is etched excessively. Therefore, the present invention achieves process stability.

Figure 3E:
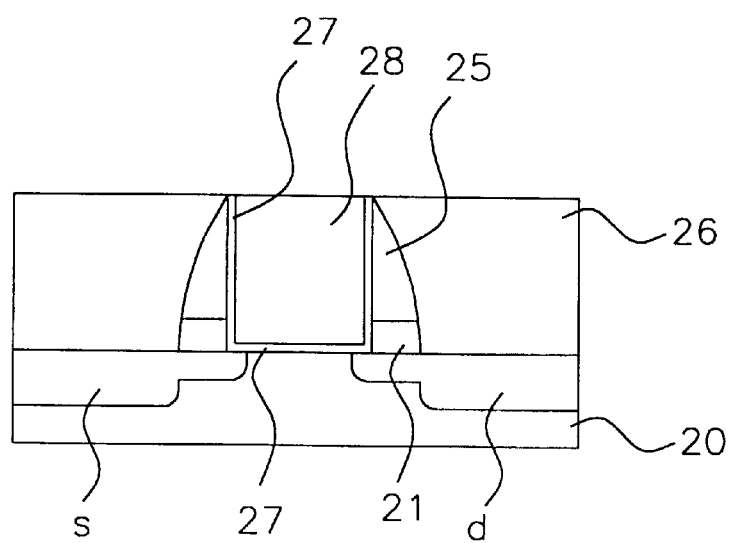

Referring to FIG. 3E, a gate insulating layer 27 and a gate metal layer 28 are deposited on the surface of the semiconductor substrate 20 from which the dummy gate silicon and silicon oxide layers were previously removed. A gate in a semiconductor device is then completed by polishing the gate metal layer 28 and insulating layers 27 until the insulating interlayer 26 is exposed.

FIGS. 4A to 4F illustrate cross-sectional views of the sequential steps in fabricating a gate in a semiconductor device using a damascene process according to another embodiment of the present invention.

Figure 4A:
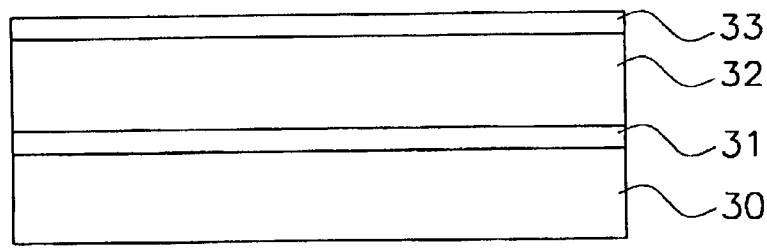
FIG. 4A to FIG. 4F illustrate cross-sectional views of fabricating a gate in a semiconductor device using a damascene process according to another embodiment of the present invention.

Referring to FIG. 4A, a field oxide layer (not shown in the drawing) defining an inventive device is formed on a surface of a semiconductor substrate 30. A dummy gate silicon oxide layer 31 is deposited on the semiconductor substrate 30. A dummy gate silicon layer 32 and a hard mask layer 33 are then successively formed on the dummy gate silicon oxide layer 31. The dummy gate silicon layer 32 is preferably formed of a doped polysilicon layer to facilitate the establishment of the wet etch condition and enable the removal of the polysilicon layer.

Figure 4B:
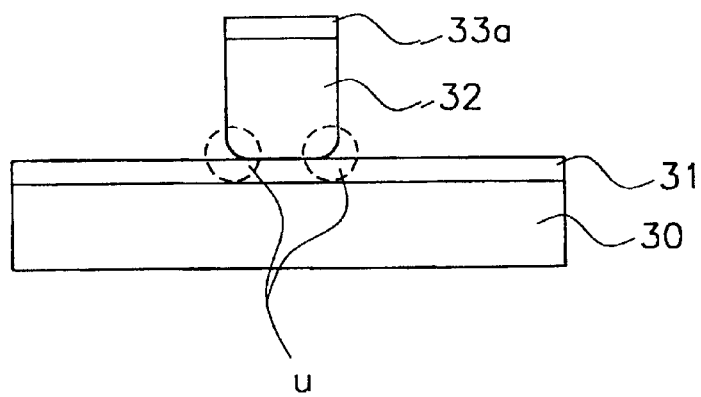

Referring to FIG. 4B, a mask pattern 33a is formed by patterning the hard mask layer 33. The dummy gate silicon layer 32 is then patterned using the mask pattern 33a as an etch barrier while bottom edges of the patterned dummy gate silicon layer are etched inwardly to form a rounded convex shape, i.e., the 'undercut' u.

Preferably, the dummy gate silicon layer 32 is patterned by a dry etch process. Thus, the undercut u is achieved by over-etch that is carried out after the main etch in the dry etching process. Namely, a process condition of the over-etch is established so that the degree of the undercut u is adjustable as desired by modifying the process time of the over-etch with a high selection ratio relative to that of the dummy gate silicon oxide layer 31. This is achieved by establishing an etch selection ratio which provides greater etching capability for the dummy gate silicon layer 32 relative to the dummy gate silicon oxide layer 31 and by using $Cl_2/O_2$ gas.

Figure 4C:
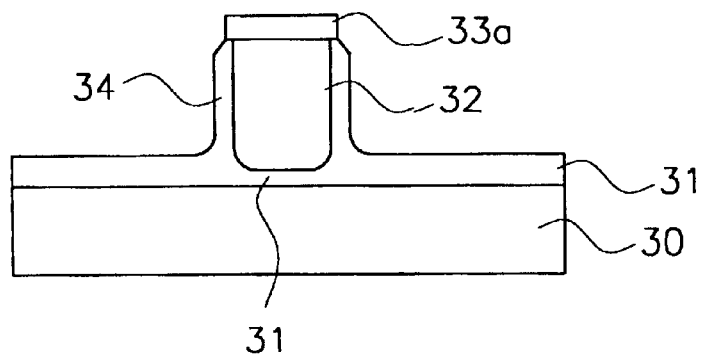

Referring to FIG. 4C, a thermal oxide layer 34 is grown at both sidewalls of the dummy gate silicon layer 32 by thermal oxidation of the semiconductor substrate 30. In this case, the dummy gate silicon oxide layer 31 becomes thickened somewhat. In addition, a rounded thermal oxide layer 34 is formed especially at the bottom edges d of the dummy gate silicon layer 32 after the thermal oxidation since the under cut u has been formed at the bottom edges d. No thermal oxide layer is grown beneath the mask pattern 33a, since the mask pattern 33a is disposed on the dummy gate silicon layer 32. Such a thermal oxidation process is carried out at a temperature of from 700 to 850° C. so as to form the thermal oxidation layer about from 50 to 100 Å thick.

Figure 4D:
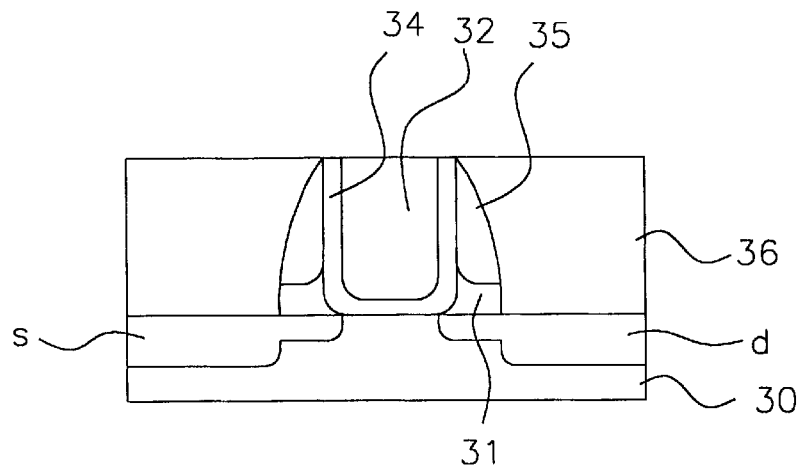

Referring to FIG. 4D, the steps for a general process of forming source/drain regions are performed, i.e., the LDD (lightly doped drain) type source/drain regions s and d are formed by carrying out ion implantation lightly on the semiconductor substrate 30, depositing a silicon nitride layer on the semiconductor substrate, carrying out a blanket-etch on the silicon nitride layer to form spacers 35, and then carrying out another ion implantation heavily. An insulating interlayer 36 is deposited on the semiconductor substrate 30. Planarization of the insulating interlayer 36 is achieved by carrying out a polishing process thereon until a surface of the dummy gate silicon layer 32 is exposed.

Figure 4E:
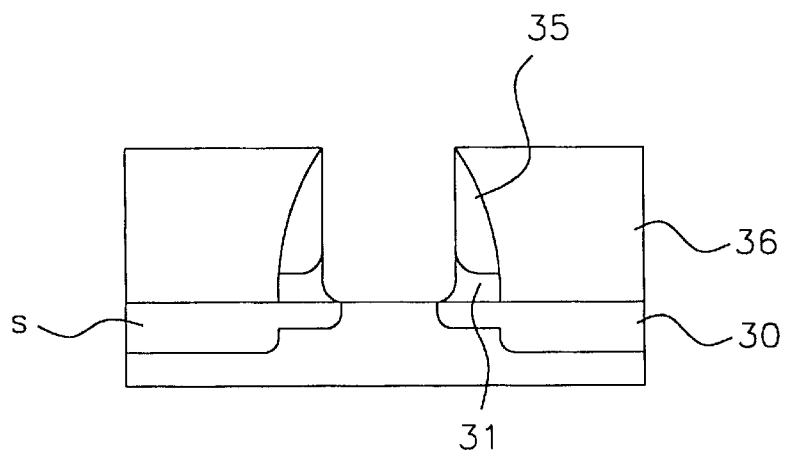

Referring to FIG. 4E, a damascene structure is formed by removing the exposed dummy gate silicon layer 32 and the dummy gate silicon oxide layer 31 underneath the spacers 35. In this case, the dummy gate silicon and silicon oxide layers are removed by wet etch. The thermal oxide 34 prevents a residue of the dummy silicon layer 32 from being generated during the wet etch as well as the undercut, such as that occurs generally in conventional processes when the dummy gate silicon oxide layer beneath the spacers 35 is etched excessively. Therefore, the present invention enables process stability during fabrication and thereafter.

Figure 4F:
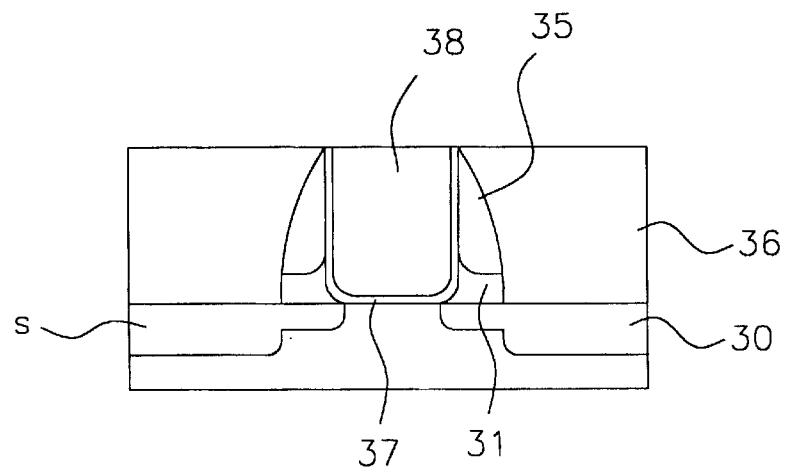

Referring to FIG. 4F, a gate insulating layer 37 and a gate metal layer 38 are deposited on the surface of the semiconductor substrate 30 from which the dummy gate silicon and silicon oxide layers have been removed. A gate in a semiconductor device is then completed by polishing the gate metal and insulating layers until the insulating interlayer 36 is exposed.

As mentioned in the above description, the present invention prevents the undercut generation at the bottom inside corner of a damascene groove when the dummy gate silicon and silicon oxide layers are removed by wet etch for forming a damascene structure. This is done by carrying out thermal oxidation after patterning the dummy gate silicon layer 32.

Moreover, another embodiment of the present invention provides a step of forming the rounded corners of the damascene groove on thermal oxidation by forming the undercut when etching the dummy gate silicon layer.

Accordingly, the present invention prevents the silicon layer residue from being produced when removing the dummy gate silicon and the insulating layers and facilitates the metal electrode deposition process by preventing the undercut, thereby enabling an increase in product yield.

The foregoing embodiments are merely exemplary and are not to be construed as limiting the present invention. The present teachings can be readily applied to other types of apparatuses. The description of the present invention is intended to be illustrative, and not to limit the scope of the claims. Any alternatives, modifications, and variations will be apparent to those skilled in the art and the invention described and illustrated herein is to be limited only by the following claims.

What is claimed is:

1. A method of forming a gate in a semiconductor device comprising the steps of:

forming a dummy gate insulating layer on a semiconductor substrate having a field oxide layer isolating the device;

depositing successively a dummy gate silicon layer and a hard mask layer on the dummy gate insulating layer;

forming a hard mask layer as a mask pattern and patterning the dummy gate silicon layer using the mask pattern as an etch barrier;

forming a thermal oxide layer at both sidewalls of the dummy gate silicon layer by carrying out thermal oxidation on the resultant structure after the patterning step;

forming spacers at both sidewalls of the dummy gate silicon layer;

depositing an insulating interlayer on the resultant structure after the spacer forming step;

polishing the insulating interlayer so as to expose the dummy gate silicon layer;

forming a damascene structure by removing the dummy gate silicon and the insulating layers by using the insulating interlayer as another etch barrier;

depositing a gate insulating layer and a gate metal layer on an entire surface of the semiconductor substrate having the damascene structure; and polishing the gate metal and insulating layers until the insulating layer is exposed.

2. The method of claim 1, wherein the dummy gate insulating layer is formed of a silicon oxide layer.

3. The method of claim 1, wherein the thermal oxidation is carried out at a temperature of from 700 to 850° C. so as to form the thermal oxidation layer from about 50 to 100 Å thick.

4. The method of claim 1, wherein the dummy gate silicon layer is formed of a doped polysilicon layer.

5. The method of claim 1, wherein the dummy gate silicon and insulating layers are removed using an isotropic etch.

6. A method of forming a gate in a semiconductor device comprising the steps of:

forming a dummy gate insulating layer on a semiconductor substrate having a field oxide layer isolating the device;

depositing successively a dummy gate silicon layer and a hard mask layer on the dummy gate insulating layer;

forming a hard mask layer as a mask pattern and patterning the dummy gate silicon layer using the mask pattern as an etch barrier and inwardly rounding bottom corners of the dummy gate silicon layer;

forming a thermal oxide layer at both sidewalls of the dummy gate silicon layer by carrying out thermal oxidation on the resultant structure after the rounding step;

forming spacers at both sidewalls of the dummy gate silicon layer;

depositing an insulating interlayer on the resultant structure after the spacer forming step;

polishing the insulating interlayer so as to expose the dummy gate silicon layer;

forming a damascene structure by removing the dummy gate silicon and insulating layers using the insulating interlayer as another etch barrier;

depositing a gate insulating layer and a gate metal layer on an entire surface of the semiconductor substrate having the damascene structure; and polishing the gate metal and insulating layers until the insulating layer is exposed.

7. The method of claim 6, wherein the hard mask and dummy gate silicon layers are patterned by a dry etch.

8. The method of claim 7, wherein the dry etch is carried out by performing a main etch and an over-etch.

9. The method of claim 7, wherein the dry etch is carried out using $Cl_2/O_2$ gas.

10. The method of claim 6, wherein the dummy gate insulating layer is formed of a silicon oxide layer.

11. The method of claim 6, wherein the thermal oxidation is carried out at a temperature of from 700 to 850° C. so as to form the thermal oxidation layer from about 50 to 100 Å thick.

12. The method of claim 6, wherein the dummy gate silicon layer is formed of a doped polysilicon layer.

13. The method of claim 6, wherein the dummy gate silicon and insulating layers are removed by using an isotropic etch.

* * * * *